United States Patent [19]

Jeromin et al.

[11] Patent Number: 5,381,014

[45] Date of Patent: Jan. 10, 1995

[54] LARGE AREA X-RAY IMAGER AND METHOD OF FABRICATION

[75] Inventors: Lothar S. Jeromin, Newark, Del.; George D. Robinson, Jr., Sewell, N.J.

[73] Assignee: E. I. Du Pont de Nemours and Company, Wilmington, Del.

[21] Appl. No.: 174,861

[22] Filed: Dec. 29, 1993

[51] Int. Cl.6 .................. G01N 23/04; G01T 1/24; H01L 31/115
[52] U.S. Cl. .................. 250/370.09; 250/580
[58] Field of Search .............. 250/370.08, 370.09, 250/370.11, 366, 580, 332; 378/98.8

[56] References Cited

U.S. PATENT DOCUMENTS

| | | |
|---|---|---|
| 3,973,146 | 8/1976 | Arnold et al. |
| 4,467,342 | 8/1984 | Tower |
| 4,670,765 | 6/1987 | Nakamura et al. |
| 4,672,454 | 6/1987 | Canella et al. |
| 4,694,317 | 9/1987 | Higashi et al. |
| 4,755,681 | 7/1988 | Oka et al. .................. 250/370.01 |
| 4,770,965 | 9/1988 | Fender et al. .................. 430/66 |
| 4,803,359 | 2/1989 | Hosoi et al. .................. 250/586 |
| 4,810,881 | 3/1989 | Berger et al. |
| 4,857,723 | 8/1989 | Modisette |
| 4,861,995 | 8/1989 | Ohgoda |
| 4,873,708 | 10/1989 | Cusano/Possin .................. 378/62 |
| 4,931,643 | 6/1990 | Amtmann |
| 4,961,209 | 10/1990 | Rowlands et al. .................. 378/29 |
| 4,975,935 | 12/1990 | Hillen et al. .................. 378/28 |
| 5,043,582 | 8/1991 | Cox et al. .................. 250/366 X |
| 5,070,248 | 12/1991 | Pesce .................. 250/483.1 |
| 5,105,087 | 4/1992 | Jagielinski .................. 250/370.09 |
| 5,127,038 | 6/1992 | Jeromin/Lee .................. 378/28 |
| 5,151,588 | 9/1992 | Kiri et al. .................. 250/370.09 X |
| 5,166,524 | 11/1992 | Lee et al. .................. 250/580 |
| 5,182,624 | 1/1993 | Tran et al. |
| 5,220,170 | 6/1993 | Cox et al. .................. 250/370.09 |
| 5,254,480 | 10/1993 | Tran |
| 5,315,101 | 5/1994 | Hughes et al. .................. 250/208.1 |
| 5,319,206 | 6/1994 | Lee et al. .................. 250/580 X |

FOREIGN PATENT DOCUMENTS

| | | | |
|---|---|---|---|
| 0125691A2 | 11/1984 | European Pat. Off. | H01L 31/16 |
| 63-3454 | 1/1988 | Japan | H01L 27/14 |

OTHER PUBLICATIONS

L. E. Antonuk et al., Development of Hydrogenated Amorphous Silicon Sensors For High Energy Photon Radiotherapy Imaging, *IEEE Transactions on Nuclear Science*, 37, No. 2, 165–170, Apr. 1990.

L. E. Antonuk et al., Development of Hydrogenated Amorphous Silicon Sensors For Diagnostic X-Ray Imaging, *IEEE Transactions on Nuclear Science*, 38, No. 2, 636–640, Apr. 1991.

L. E. Antonuk et al., Signal, Noise, and Readout Considerations in The Development of Amorphous Silicon Photodiode Arrays For Radiotherapy and Diagnostic X-Ray Imaging, *SPIE*, 1443 Medical Imaging V: Image Physics, 108–119, (1991).

L. E. Antonuk et al., Development of Thin-Film, Flat-Panel Arrays For Diagnostic and Radiotherapy Imaging, *Conference Proceedings of SPIE Medical Imaging VI*, Newport Beach, Calif., Feb. 23–27, 1992.

L. E. Antonuk et al., Large Area Amorphous Silicon Photodiode Arrays for Radiotherapy and Diagnostic Imaging, *Nuclear Instruments and Methods in Physics Research*, A310 (1991), pp. 460–464.

*Primary Examiner*—Constantine Hannaher
*Assistant Examiner*—Edward J. Glick
*Attorney, Agent, or Firm*—Thomas H. Magee

[57] ABSTRACT

A large area X-ray image capture element is fabricated by juxtaposing a plurality of discrete array modules in an assembly over the top surface of a base plate, such that each module is disposed adjacent at least one other module to form a two-dimensional mosaic of modules. Each of the discrete modules includes a plurality of thin-form transistors arrayed adjacent the top surface of a dielectric substrate wherein at least one precision-ground edge forms a precise abutment with a precision-ground edge of another substrate. A continuous radiation detecting layer is disposed over the plurality of juxtaposed modules, and produces a latent radiographic image in the form of electrical charges. Such a method minimizes or totally voids the non-radiation-detecting areas created at the borders between the array modules.

20 Claims, 5 Drawing Sheets

LARGE AREA X-RAY IMAGER AND METHOD OF FABRICATION

BACKGROUND OF THE INVENTION

1. Field of the Invention

This invention pertains to capturing X-ray images and, more particularly, to an X-ray image capture element formed of a continuous photoconductive layer that converts a pattern of incident X-ray radiation into a pattern of electrical charges representative of the radiographic pattern. The photoconductive layer is formed over a two-dimensional array of solid state modules which capture the pattern of electrical charges and record digital representations of radiographic images.

2. Description of the Related Art

Although silver halide-based film systems are traditionally used in medical and industrial markets to capture patterns of X-rays that have been imagewise attenuated during passage through an object to be analyzed, non-film image capture systems are being introduced to reduce the time needed before radiograms are available and also to eliminate the expenses of film and processing. Scintillators and other X-ray sensitive devices have been used to convert the X-ray pattern into visible images that are converted into electrical signal patterns for subsequent enhancement, analysis, display and storage. More recently, systems have been developed to capture patterns of X-rays using solid state components, generally employing X-ray sensitive phosphors, intensifiers or photoconductive materials to convert X-ray patterns into electrical signal patterns. These systems generally involve converting an area X-ray image pattern into a corresponding array of electrical signals that are subsequently used to produce a visible display of the captured image. Most of these systems utilize converting apparatus formed from arrays of microelectronic devices that are produced with manufacturing processes whose yields are drastically reduced as the size of the array increases, Consequently, there are practical limitations to the maximum size of the captured X-ray image pattern. Hence solid state de,vices that capture X-ray patterns and produce electrical representations of the pattern cannot be readily produced in sizes large enough to capture the full size of popularly used X-ray imaging fields, for example, up to 14×17 inches as used to capture a chest X-ray.

Recent efforts to overcome this size limitation included assembling a large solid state X-ray sensor from a plurality of smaller solid state X-ray detectors which can be manufactured at reasonable yields. The use of such an assembly introduced a further problem, however, in that blind, non-radiation-detection areas are introduced at the borders of the individual detectors. These blind borders, between radiation detection areas, have been filled in by overlying smaller solid state radiation detectors, as described tier example in U.S. Pat. No. 5,105,087. In mother system, described in U.S. Pat. No. 4,873,708, a photodetector array having 14×17 inch dimensions is constructed by physically staggering 16 separate, electrically paired, modular charge-transfer devices in two rows such that the individual charge-transfer modules forming a row are aligned in an offset but overlapping positional relationship with respect to the next adjoining row. This array is scanned across the X-ray pattern to be captured using signal processing schemes to store and shift captured electrical signals between rows of charge-transfer devices until the signals exit the array for further processing. Older systems, like those described in U.S. Pat. No. 4,755,681, employ a plurality of separate radiation detectors and signal processing circuits arrayed in a two dimensional pattern having staggered joints between rows of the detectors to avoid a straight non-radiation-detection line. Shingle patterns and overlap patterns have also been used to produce an array of separate solid state radiation image detectors, as described in U.S. Pat. No. 4,467,342. These efforts are all directed at solving the problem of producing a large area radiation detector without introduction of non-radiation-detection or blind areas. None of the above prior art has suggested or recognized the advantage of eliminating the non-radiation-detection areas of an X-ray image capture element.

SUMMARY OF THE INVENTION

The present invention comprises a large area X-ray image capture element fabricated by juxtaposing a plurality of discrete array modules in an assembly over the top surface of a base plate, such that each module is disposed adjacent at least one other module to form a two-dimensional mosaic of modules. Each of the discrete modules includes a plurality of thin-film transistors arrayed adjacent the top surface of a dielectric substrate wherein at least one precision-ground edge forms a precise abutment with a precision-ground edge of another substrate. A continuous radiation detecting layer is disposed over the plurality of juxtaposed modules, and produces a latent radiographic image in the form of electrical charges. Such a method minimizes or totally voids the non-radiation-detecting or blind areas created at the borders between the array modules.

DETAILED DESCRIPTION OF THE PREFERRED EMBODIMENTS

Figure 1:
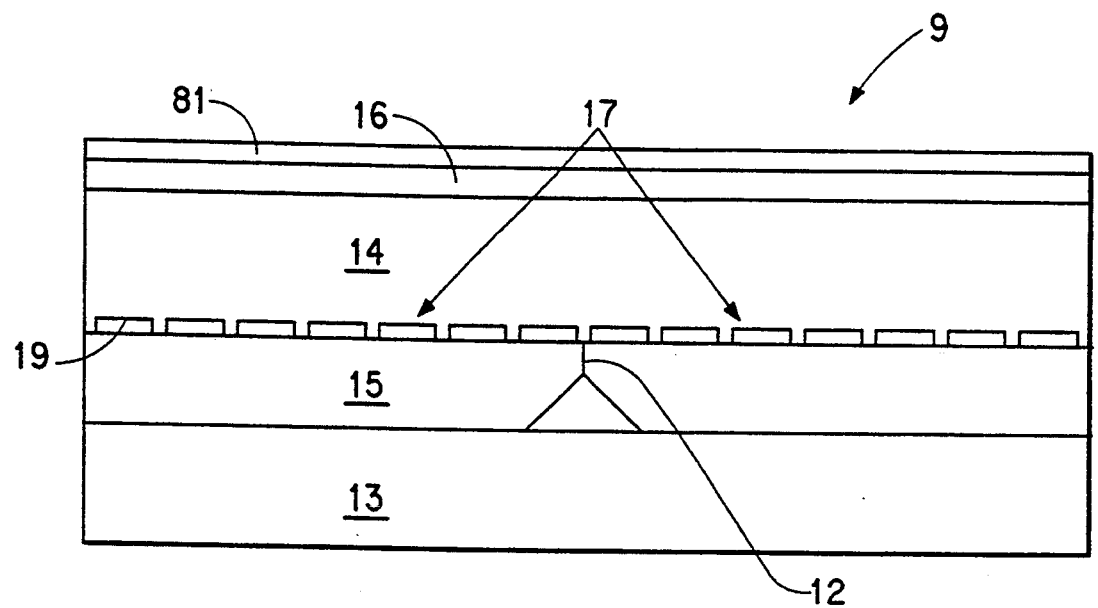
FIG. 1 is a schematic cross-sectional view of a portion of an X-ray image capture element in accordance with the present invention.

FIG. 1 shows an image capture element 9 that is capable of convening a pattern of imagewise modulated radiation into a plurality of electrical charges representative of the imagewise modulated radiation. In accordance with the present invention, at least two adjoining array modules 17, which detect electrical charges, are contiguously positioned onto a base plate 13 to form the image capture element 9. The base plate 13 is formed, for example, from a glass plate or composite material such as ceramic or carbon fiber laminates. The array modules 17 are positioned such that a butt joint 12 is provided between adjacent edges of the two juxtaposed array modules 17. Each array module 17 comprises a dielectric substrate 15 having at least two beveled edges, a plurality of transistor-capacitor pixels 19, and electronic addressing mid read-out means described later in more detail. The term pixel is used herein to define the smallest resolvable portion of the radiation pattern. The dielectric substrates 15 upon which the transistor-capacitor pixels 19 are to be fabricated are processed as follows. Two sides, adjacent to a corner, of each substrate 15 are precision ground to a 90-degree±4 seconds intersecting angle. The edges of each substrate 15 are ground to a 90-degree±4 seconds angle perpendicular to the top surface. A 30 degree bevel is ground on the bottom of each substrate 15 along the edges where the substrates 15 are to be butted together to reduce the surface area of contact between substrates 15. All mating edges are lapped together using a 40 micron lapping compound, tier example, Micro-Grit.

A key feature of the present invention is a continuous radiation detecting material layer 14 formed over the plurality of array modules 17 to provide a singular, continuous means to detect incident X-ray radiation. The continuous nature of this layer eliminates all non-radiation-detection or blind areas created in previous large area solid state detector arrays by borders of non-radiation-sensitive material, and also eliminates the need to overlay non-radiation-detection areas with additional radiation detectors by a tiling or shingle scheme. In a first embodiment, the radiation detecting layer 14 is a photoconductive material which exhibits very high dark resistivity and may comprise any material exhibiting photoconductivity, meaning that upon exposure to X-radiation, the photoconductive material exhibit reduced resistivity relative to that in the absence of such exposure. The specific type of radiation detecting material selected will further depend upon the desired charge generation efficiency and charge transport property, and the desired simplicity of manufacture. Selenium is one preferred material although cadmium sulfide, mercuric iodide, or lead oxide could be used.

Figure 1A:
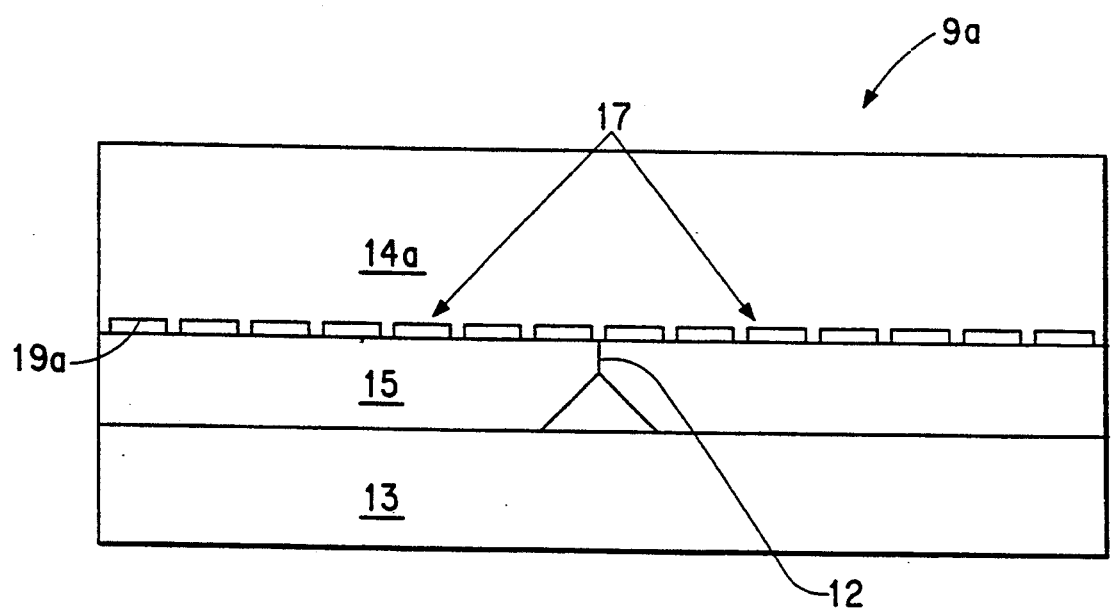
FIG. 1a is a schematic cross-sectional view of a portion of an X-ray image capture element in accordance with an alternate embodiment of the present invention.

FIG. 1a shows an alternate embodiment of the present invention wherein the radiation detecting layer 14a is chosen to be a scintillating material, the scintillating material converting incident radiation into visible light to detect the radiation pattern, the pattern then being converted in this embodiment into a plurality of electrical charges by means of a transistor-photodiode pixel 19a. In this embodiment, a plurality of transistor-photodiode pixels 19a are employed in place of the above described transistor-capacitor pixels 19. The photodiodes are formed using a layer of amorphous or polycrystalline silicon deposited between p-doped and n-doped layers of amorphous silicon. Typical thicknesses of the charge-doped layers are 25–100 nanometers, and the amorphous or polycrystalline silicon layer is typically one micron, a thickness capable of absorbing all the photons generated within the scintillating material layer 14a. As is well known, thicknesses of the various layers in the photodiode can be adjusted to maximum electrical charge capture, depending on the spectral emission wavelength of the scintillating radiation detecting material. A further deposition of conductive material that is transparent to X-rays, preferably indium-tin-oxide, is useful in enabling electrical readout. The scintillating radiation detecting material is preferably chosen from the group consisting of gadolinium oxysulfide, calcium tungstate. $BaSiO_3$ activated with lead. $YPO_4$ activated with gadolinium, indium or combinations thereof, $Ca_2ZrSi_4O_{12}$ activated with lead, and $BaZnSiO_2$ activated with lead. Typical thickness of the radiation detecting layer 14a is 500 microns, and this material is applied at a density of no more than 5.3 $g/cm^3$, by means of wet chemical coating techniques, preferably blade coating. The scintillating radiation detecting material is dispersed in suitable binder, chosen to not deleteriously absorb light emitted from the binder. Such binders include polyvinyl butyral, a sodium o-sulfobenzaldehyde acetal of polyvinyl alcohol, and polyurethane elastomers. One preferred binder comprises copolymers of alkyl acrylates and methacrylates with acrylic and methacrylic acid.

In FIG. 1, the radiation detecting layer 14 is applied over the plurality of array modules 17, using vapor deposition techniques, in sufficient thickness to absorb the incident X-radiation, or a substantial portion thereof to provide high efficiency in radiation detection. A partially crystallized selenium-arsenic alloy having about 1 percent by weight arsenic is preferably used to produce uniform layer thickness, although an amorphous alloy cart also be used. No adhesion layer is employed between the array modules 17 and the deposited selenium layer, the selenium layer being deposited until a thickness on the order of 150 to 400 micrometers is achieved. As is well known in the an, it is often necessary to vary the alloy contents, deposition geometries, crucible and substrate temperatures, vacuum pressure, substrate cleaning, and annealing procedures to yield selenium photoconductive layers optimized for the intended application. See, for example, U.S. Pat. No. 4,770,965 and its reference patents. It may be necessary to modify the above process to optimize the radiation detection characteristics of the selenium layer. However, this does not affect the advantage of the continuous layer of radiation detecting material 14, which provides a singular, continuous means to detect incident X-ray radiation and is a key feature of the present invention.

After the continuous radiation detecting layer 14 is formed, a dielectric layer 16 is added on the top surface of the detecting layer 14 opposite the array modules 17, preferably using a lamination and uv-curable adhesive or wet coating process such as spin, dip or blade coating. In a preferred embodiment of the present invention, the dielectric layer 16 comprises a layer of polyethylene terephalate (Mylar ®) having a thickness greater than 10 microns, as this material has been found to be well-suited for the lamination process. In an alternative wet, blade coating process, polyquinolone is a preferable material. A final top layer 81 of conductive material, such as indium-tin oxide, aluminum, gold, copper, or any other conductive material that is substantially transparent to X-radiation is formed over the dielectric layer 16, using well known sputtering or vapor deposition techniques.

Figure 2:
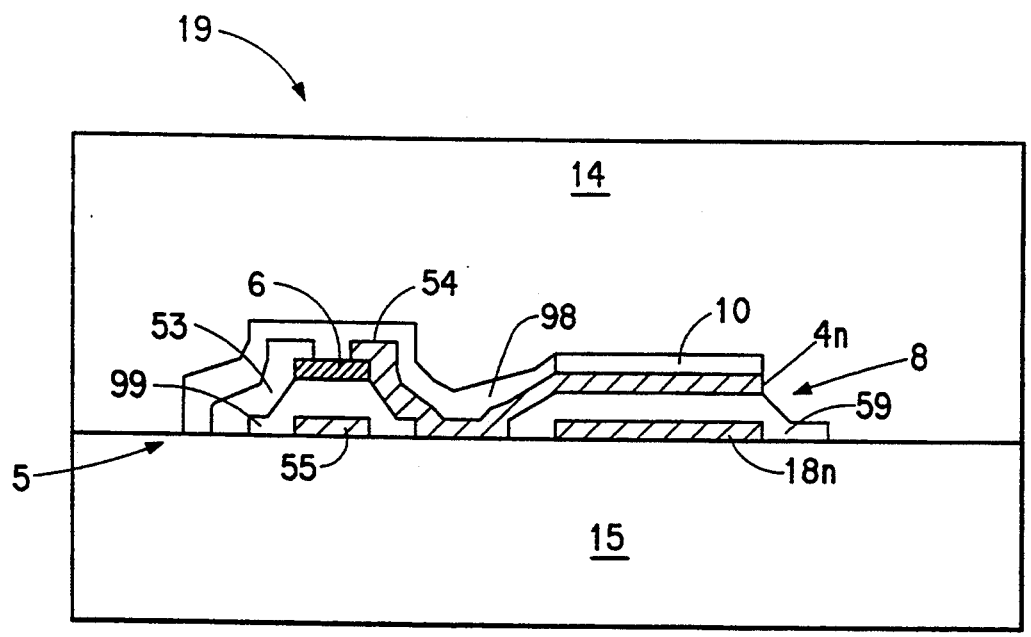
FIG. 2 is a schematic cross-sectional view of an electrical charge detecting array.

FIG. 2 shows a single transistor-capacitor pixel 19 from among the plurality of such pixels positioned over the dielectric substrate 15. The capacitor of each pixel 19, shown schematically in FIG. 3 as item 8, is formed from a plurality of discrete minute conductive outer microplates 18n (i.e., 18a, 18b, 18c, . . . 18n), preferably made of aluminum having dimensions that define the aforementioned pixel, the smallest picture element resolvable by the transistor-capacitor pixel 19. Each microplate 18n is connected to electrical ground by conductive lines not shown. Over this plurality of outer microplates 18n is applied a capacitive dielectric material 59, such as silicon dioxide or silicon nitride. A plurality of inner microplates 4n (i.e., 4a, 4b, 4c, . . . 4n), preferably made of a very thin film of metal such as aluminum or indium-tin oxide, is deposited over the dielectric material 59 to complete the capacitor 8. A charge blocking layer 10, typically aluminum oxide when the inner microplate 4n is made of aluminum, is provided over the top surface of the inner microplates 4n. The combination of layers 4n, 10, and 14 behaves as a blocking diode, inhibiting one type of charge flow in one direction. The charge blocking layer 10 must have sufficient thickness to prevent charge leakage, typically greater than 100 Angstroms.

Figure 3:
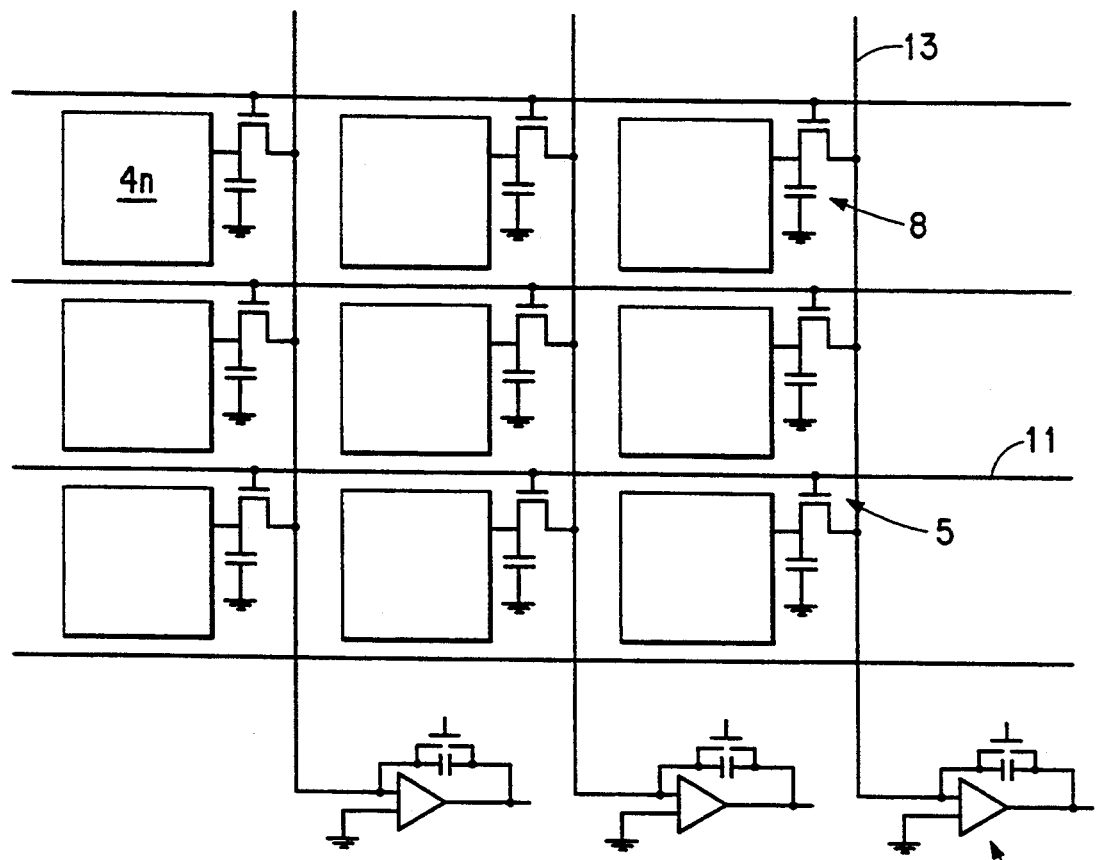
FIG. 3 is a schematic top view of an electrical charge detecting array in accordance with the present invention.

FIG. 3 shows conductive electrodes or X1, X2, . . . Xn address lines 11 and conductive electrodes or Y1, Y2, . . . Yn sense lines 13 laid out generally orthogonally to each other in the spaces between the transistor-capacitor pixels 19. The Xn address lines 11 are individually accessible through leads or connectors not specifically illustrated in the drawings, along the sides or edges of the array 17. Each Yn line 13 is also connected to a charge amplifying detector 36 which produces a voltage output proportional to such charge. The technology to sample sequentially the output of the charge amplifying detectors to obtain an output signal, and the technology to form the charge amplifying detectors are well known in the art.

FIG. 3 further shows a transistor 5 connecting each microplate 4n to an Xn line 11. Each transistor 5, typically comprises a field-effect transistor, FET, preferably having a hydrogenated amorphous-silicon layer 6, an insulating layer 99, a gate 55 connected to Xn address lines 11, and the two conductive electrodes, one electrode 53, the drain of the transistor, being connected to the Yn sense lines 13 and the other electrode 54, the source of the transistor, being connected to the inner microplates 4n. The transistors 5 serve as bi-directional switches allowing current flow between the Yn sense lines 13 and the charge storage capacitors 8 depending on whether a bias voltage is applied to gate 55 through Xn address lines 11. The transistor 5 could be formed using polycrystalline silicon, crystalline silicon or cadmium selenide for its semiconducting material layer 6, and is covered with a passivation layer 98 and shielded from low-energy radiation using dielectric substrate layer 15 or by using additional layers. For purposes of the present invention, low-energy radiation means ultraviolet, infrared, or visible radiation, but excludes X-radiation and gamma-radiation. The technology for the creation of the transistors 5, charge storage capacitors 8, photodiodes, inner microplates 4n and outer microplates 18n is well known in the art, and is also described for instance in "Modular Series on Solid State Devices," Volume 5 of Introduction to Microelectronics Fabrication by R. C. Jaeger, Published by Addison-Wesley in 1988.

Figure 4:
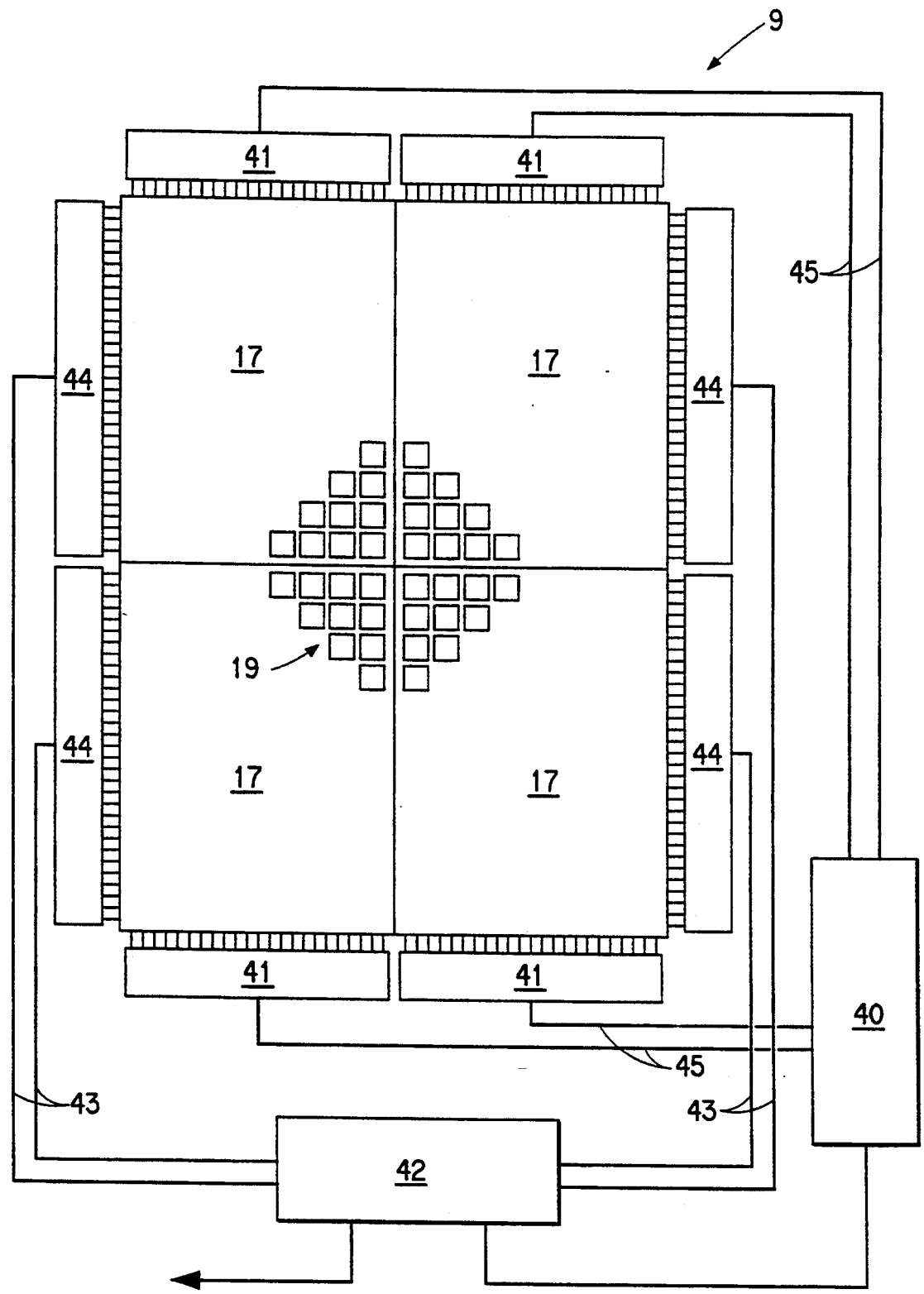
FIG. 4 is a schematic top view of the X-ray image capture element in accordance with the present invention.

FIG. 4 shows four array modules 17 positioned together to form a larger image capture element 9. Using this approach, four 7×8.5 inch arrays, for example, are combined to produce a single 14×17 inch image capture element 9. Several transistor-capacitor pixels 19 are shown near the intersection of the array modules 17. In the instance that a single row of transistor-capacitor pixels 19 is effectively eliminated by the abutment process, that row of radiation pattern information is replaced by interpolation from the adjacent unaffected rows of transistor-capacitor pixels 19. This information loss is constrained to be no more than a single row of transistor-capacitor pixels 19 because of the combination of physical size of the transistor-capacitor pixel 19 and the precision lapping of the array substrates 15. In other approaches to producing large-scale arrays wherein singular array modules are finally produced before the larger-scale array is assembled, the radiation detecting layer is discontinuous and, as a consequence of Feathering of the radiation detection layer at the abutting edges of the arrays, more than a single row of radiation pattern information will be missing. Linear interpolation is preferably used, however, other methods are also applicable. Electronic addressing means 44 for the array modules 17 are separate for each of the modules 17, and these electronic means 44 address each of the individual transistor-capacitor pixels 19 and are electronically connected over lines 43 to a central control unit 42. The control unit 42 enables sequential electronic access to the gates of the transistor-capacitor pixels 19 and simultaneous electronic access to the array modules 17, thus reducing readout time. Electronic signal readout means 41 are connected to the transistor-capacitor pixels 19 and also to a multiplexing module 40 over lines 45. The multiplexing module 40 is also connected to the central control unit 42 which provides control signals to the transistor-capacitor pixels 19 and receives electronic signals indicative of the strength of an incident imagewise-modulated X-ray pattern from each of the charge storage capacitors 8. If more than four array modules are needed to be assembled in abutting fashion, it is necessary to change the electronic addressing means from one using connections made at the outer edges of the array modules in order to access the innermost array modules, for instance the 2 inner array modules in a pattern of six array modules. In this situation, through-hole, or via interconnections are made at the edges of the inner arrays, the vias extending to the bottom of the substrates 15 and exiting at the electrically accessible back side of the image element 9.

Figure 5:
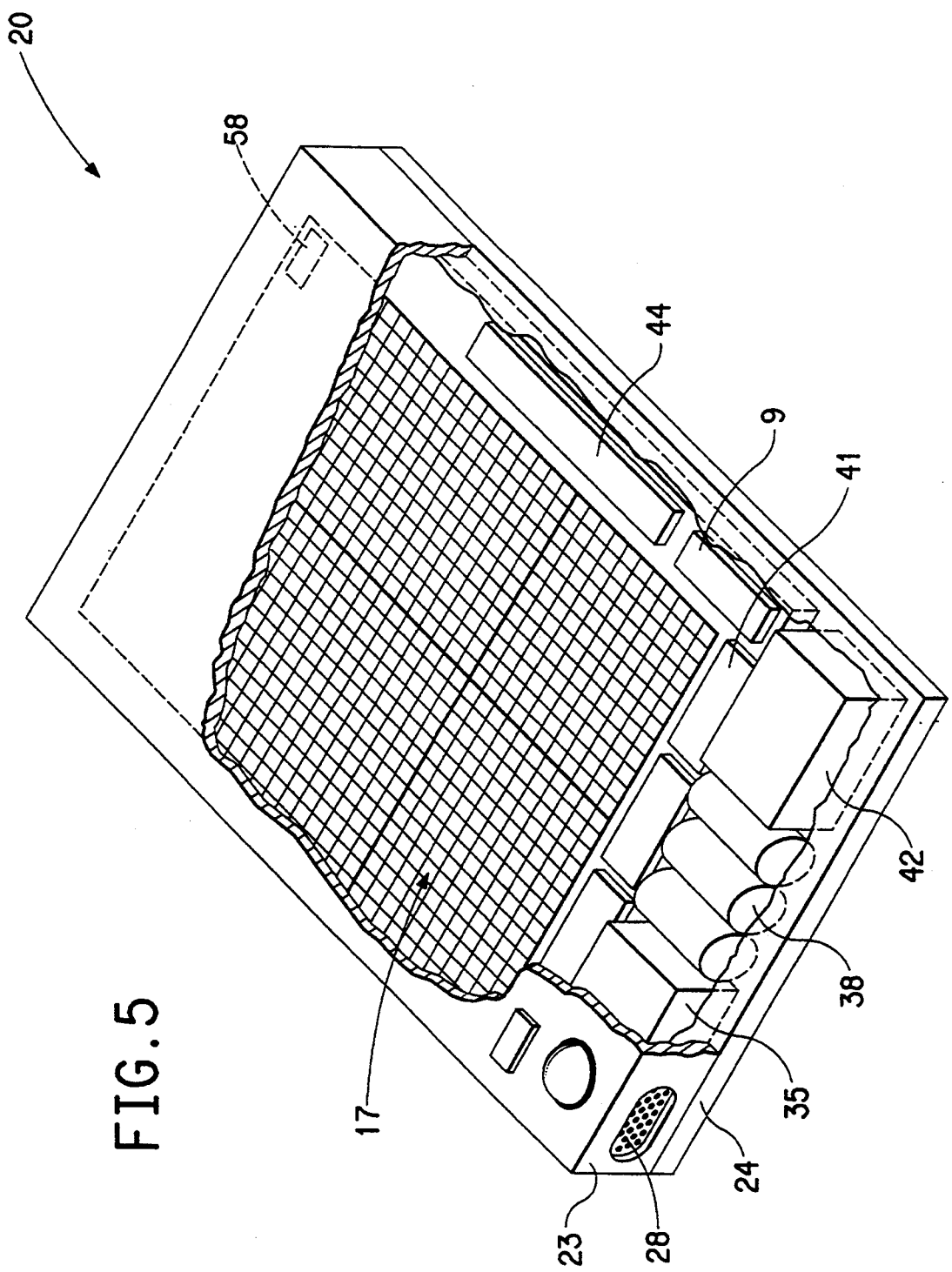
FIG. 5 is a perspective view of an electronic cassette containing an X-ray image capture element in accordance with the present invention.

FIG. 5 shows the essential features of an electronic cassette 20 formed by front and back members 23 and 24, respectively, that would typically be used to house an X-ray image capture element 9 comprising, for example, four array modules 17. The central control unit 42 causes power from a power supply 38 to be supplied to the X-ray image capture element 9 and also activates all the addressing electronics 44 and readout electronics 41 associated with the X-ray image capture element 9. The impinging radiation is converted to a plurality of electrical charges by the X-ray image capture element 9. When X-ray sensor 58 senses presence of X-radiation followed by absence of X-radiation, a process of digitizing the plurality of electrical charges begins within the X-ray-image capture element 9. This plurality of charges is converted within the readout electronics 41 to produce a plurality of digitized image element values, and these values are transferred to electronic memory storage means 35 which could be solid-state memory circuits or a miniature magnetic or optical digital recorder located within the electronic cassette 20. When it is desired to read out the radiogram recorded in memory storage means 35, the digitized image element values are directed to the central control unit 42 and then to connector 28 on the electronic cassette 20. After the digitized image element values are stored in memory, central control unit 42 causes the image capture element 9 to be erased in preparation for capturing a subsequent radiogram.

Figure 6:
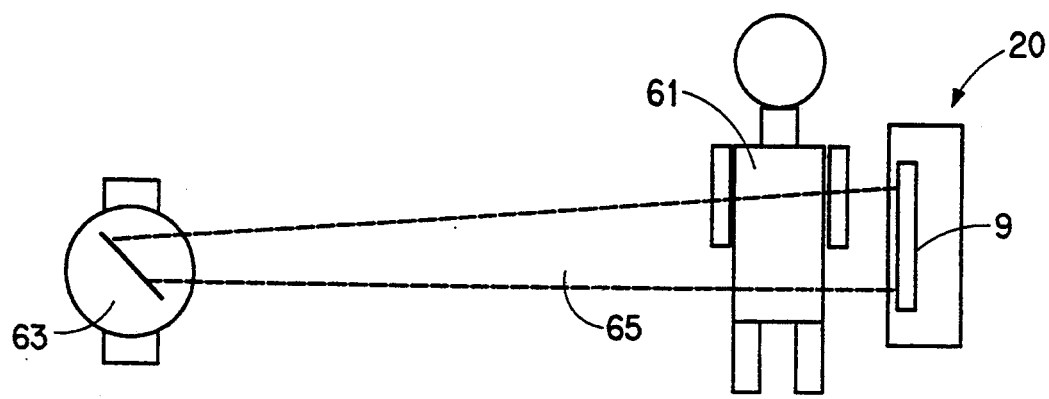
FIG. 6 is an elevation view of an arrangement for using an X-ray image capture element in accordance with the present invention.

FIG. 6 shows the image capture element 9 in its process of use. Electronic cassette 20 containing image capture element 9 is placed by an operator, generally a medical technician, in a first position much like a standard screen-film cassette is used to receive a first imagewise modulated X-ray pattern. A target 61, i.e., a patient in the case of medical diagnostic imaging, is positioned in an X-ray beam path 65 emitted by a source of X-radiation 63. The radiation emerging through the target 61 is imagewise modulated in intensity because of the different degree of X-ray absorption in the target 61 and the pattern of this imagewise modulated radiation is captured and stored by image capture element 9 contained in the electronic cassette 20.

Figure 7:
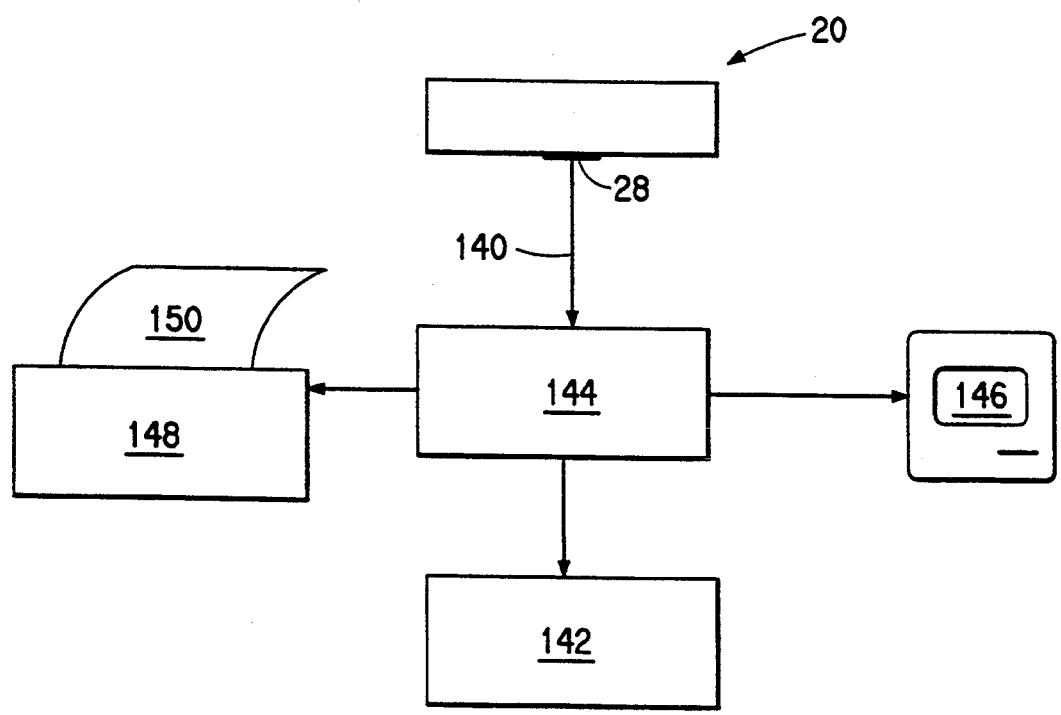
FIG. 7 is a block diagram of an arrangement for the capture and display of a radiogram using an X-ray image capture element in accordance with the present invention.

FIG. 7 shows the digitized picture element values obtained from the electronic cassette 20 using connector 28 and directed to an external computer 144 via line 140. Computer 144, inter alia, directs the signal to appropriate storage means which may be either an internal RAM memory within a host computer or a long term archive memory 142 or both. In the process, the data representing the radiogram is reconstructed to represent the pattern of incident radiation and may undergo image processing, such as filtering, contrast enhancement by many different external systems for permanently recording digital data, modifying the data to facilitate interpretation and reconstructing the digitized picture element values into visible images, and may be displayed on a CRT 146 for immediate viewing or used in a printer 148 to produce a hard copy 150, or sent to a remote reading location by means of teleradiography.

What is claimed is:

1. An X-ray image capture element comprising:
    a base plate having a top surface and a bottom surface;
    a plurality of discrete array modules juxtaposed over the top surface of the base plate such that each module is disposed adjacent at least one other module to form a two-dimensional mosaic of modules, each of said modules including a dielectric substrate having a top surface and a bottom surface disposed adjacent the top surface of said base plate, and a plurality of transistors arrayed adjacent the top surface of said dielectric substrate; and
    a continuous radiation detecting layer disposed over the plurality of array modules, said radiation detecting layer for producing electrical charges representative of a pattern of incident x-ray radiation.

2. An X-ray image capture element in accordance with claim 1, wherein the dielectric substrate of each array module is rectangular in shape, and wherein at least one precision-ground edge of each dielectric substrate forms a precise abutment with a precision-ground edge of another dielectric substrate in a lateral plane substantially parallel to the top surface of said base plate.

3. An X-ray image capture element in accordance with claim 2 wherein each precision-ground edge has a bevel disposed adjacent the bottom surface of the dielectric substrate.

4. An X-ray image capture element in accordance with claim 1 wherein said transistors are thin-film transistors, and wherein each of said array modules further includes a plurality of charge storage capacitors also arrayed adjacent the top surface of said dielectric substrates, each capacitor being connected to at least one of the thin-film transistors.

5. An X-ray image capture element in accordance with claim 4 wherein the thin-film transistors comprise semiconducting material selected from the group consisting of amorphous silicon, polycrystalline silicon, crystalline silicon and cadmium selenide.

6. An X-ray image capture element in accordance with claim 4 wherein each charge storage capacitor comprises a conductive outer microplate disposed on the top surface of the dielectric substrate, dielectric material disposed over said outer microplate, and a conductive inner microplate disposed over said dielectric material opposite said outer microplate, each inner microplate being connected to a separate one of the thin-film transistors.

7. An X-ray image capture element in accordance with claim 6 further comprising means disposed adjacent the top surface of each dielectric substrate for electronically activating the transistors in each array module and for individually accessing the charge storage capacitors in each array module.

8. An X-ray image capture element in accordance with claim 7 wherein each transistor in each array module is a thin-film field effect transistor (FET) having a source connected to one of said inner microplates, and a drain and a gate both connected to said means for activating and accessing.

9. An X-ray image capture element in accordance with claim 8 wherein the means for activating and accessing comprise:
    a plurality of discrete conductive address lines extending along the transistors in each array module and connected, respectively, to the gates of adjacent transistors, and
    a plurality of discrete conductive sense lines extending along the transistors in each array module in a direction across the address lines and connected, respectively, to the drain regions of adjacent transistors.

10. An X-ray image capture element in accordance with claim 1 further comprising:
    a continuous dielectric layer disposed over the radiation detecting layer opposite the array modules and coextensive with the radiation detecting layer; and
    a continuous top conducting layer disposed over the dielectric layer opposite the radiation detecting layer and coextensive with the dielectric layer.

11. An X-ray image capture element in accordance with claim 10 wherein the continuous radiation detecting layer comprises material selected from the group consisting of selenium, cadmium sulfide, lead oxide and mercuric oxide.

12. An X-ray image capture element in accordance with claim 10 wherein the continuous dielectric layer comprises a material selected from the group consisting of polyethylene terephalate and polyquinoline.

13. An X-ray image capture element in accordance with claim 10 wherein the continuous top conducting layer is a material selected from the group consisting of indium-tin oxide, aluminum, gold and copper.

14. A method for producing an X-ray image capture element comprising:

juxtaposing a plurality of discrete array modules in an assembly over the top surface of a base plate such that each module is disposed adjacent at least one other module to form a two-dimensional mosaic of the modules, each of said modules including a dielectric substrate having a top surface and a bottom surface placed adjacent the top surface of said base plate, and a plurality of transistors arrayed adjacent the top surface of said dielectric substrate; and forming a continuous radiation detecting layer over the plurality of array modules, said radiation detecting layer for producing electric charges representative of a pattern of incident x-ray radiation.

15. A method for producing an X-ray image capture element in accordance with claim 14 wherein the dielectric substrate of each array module is rectangular in shape, and wherein the juxtaposing step is performed by precisely cutting and grinding at least one edge of each dielectric substrate and by abutting a precision-ground edge of each dielectric substrate with a precision-ground edge of another dielectric substrate in a lateral plane substantially parallel to the top surface of said base plate such that the non-radiation detecting space between the array modules is minimized.

16. A method for producing an X-ray image capture element in accordance with claim 15 wherein the cutting and grinding step also includes forming a bevel in each precision-ground edge adjacent the bottom surface of the dielectric substrate.

17. A method for producing an X-ray image capture element in accordance with claim 14 further comprising the steps of:

forming a continuous dielectric layer over the radiation detecting layer opposite the array modules and coextensive with the radiation detecting layer; and forming a continuous top conducting layer over the dielectric layer opposite the radiation detecting layer and coextensive with the dielectric layer.

18. A method for producing an X-ray image capture element in accordance with claim 17 wherein the step of forming the continuous radiation detecting layer is performed by depositing a layer of material having a thickness of at least 500 micrometers and selected from the group consisting of selenium, cadmium sulfide, lead oxide and mercuric oxide.

19. A method for producing an X-ray image capture element in accordance with claim 17 wherein the step of forming the continuous dielectric layer is performed by laminating a layer of polyethylene terephalate or coating a layer of polyquinoline to the radiation detecting layer.

20. A method for producing an X-ray image capture element in accordance with claim 17 wherein the step of forming the continuous top conducting layer is perforated by vapor depositing a material selected from the group consisting of indium-tin oxide, aluminum, gold and copper.

* * * * *

REEXAMINATION CERTIFICATE (3220th)

United States Patent [19]
Jeromin et al.

[11] B1 5,381,014
[45] Certificate Issued Jun. 10, 1997

[54] LARGE AREA X-RAY IMAGER AND METHOD OF FABRICATION

[75] Inventors: Lothar S. Jeromin, Newark, Del.; George D. Robinson, Jr., Sewell, N.J.

[73] Assignee: E. I. Du Pont de Nemours and Company, Wilmington, Del.

Reexamination Request:
No. 90/004,104, Jan. 16, 1996

Reexamination Certificate for:
Patent No.: 5,381,014
Issued: Jan. 10, 1995
Appl. No.: 174,861
Filed: Dec. 29, 1993

[51] Int. Cl.$^6$ .................. G01N 23/04; G01T 1/24; H01L 31/115
[52] U.S. Cl. .................. 250/370.09; 250/580
[58] Field of Search .................. 250/370.09, 580, 250/370.14

[56] References Cited

U.S. PATENT DOCUMENTS

| | | |
|---|---|---|
| 4,467,342 | 8/1984 | Tower . |
| 4,999,484 | 3/1991 | Kaneko . |
| 5,043,582 | 8/1991 | Cox et al. . |
| 5,182,624 | 1/1993 | Tran et al. . |
| 5,220,170 | 6/1993 | Cox et al. . |
| 5,254,480 | 10/1993 | Tran . |
| 5,315,101 | 5/1994 | Hughes et al. . |
| 5,319,206 | 6/1994 | Lee et al. .................. 250/370.09 |

OTHER PUBLICATIONS

Chikamura, T., et al., "The Characteristics of Amorphous Silicon TFT and Its Application in Liquid Crystal Display", *Materials Research Society Symposium Proceedings*, vol. 95, 1987, pp. 421–430.

Burke, Barry E., et al., "420×420 Charge–Coupled–Device Imager and Four–Chip Hybrid Focal Plane", *Optical Engineering*, vol. 26, No. 9, Sep. 1987, pp. 890–896.

Zhao, W., et al., "A Large Area Solid–State Detector for Radiology Using Amorphous Selenium", *Medical Imaging VI: Instrumentation, Proceedings of The Society of Photo–Optical Instrumentation Engineers*, vol. 1651, Feb. 23–24, 1992, pp. 134–143.

*Primary Examiner*—Carolyn E. Fields

[57] ABSTRACT

A large area X-ray image capture element is fabricated by juxtaposing a plurality of discrete array modules in an assembly over the top surface of a base plate, such that each module is disposed adjacent at least one other module to form a two-dimensional mosaic of modules. Each of the discrete modules includes a plurality of thin-form transistors arrayed adjacent the top surface of a dielectric substrate wherein at least one precision-ground edge forms a precise abutment with a precision-ground edge of another substrate. A continuous radiation detecting layer is disposed over the plurality of juxtaposed modules, and produces a latent radiographic image in the form of electrical charges. Such a method minimizes or totally voids the non-radiation-detecting areas created at the borders between the array modules.

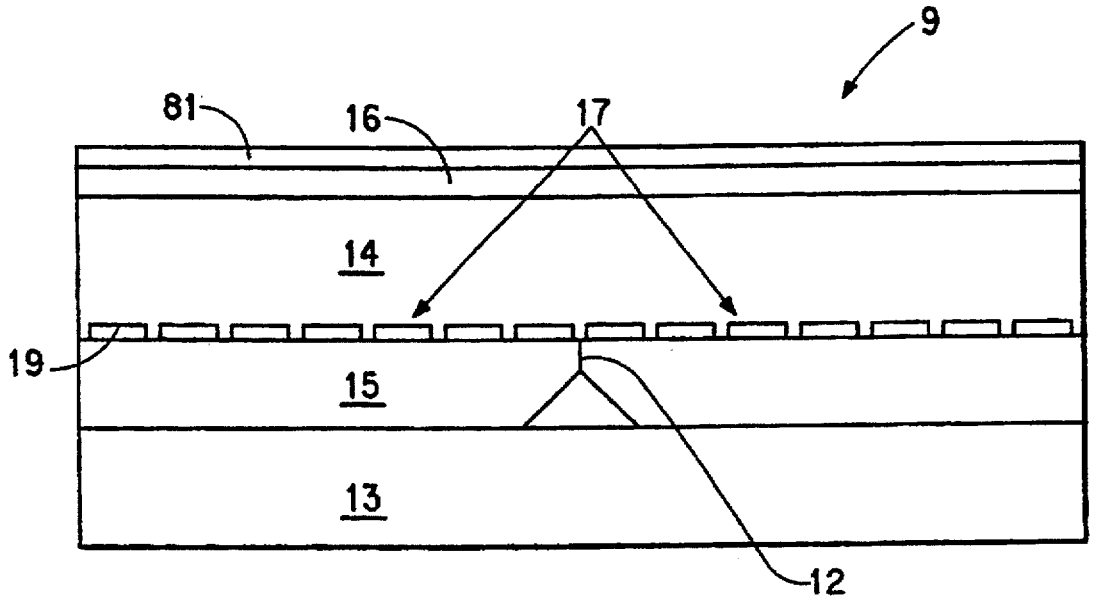

B1 5,381,014

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1–3, 14–16 and 20 are determined to be patentable as amended.

Claims 4–13 and 17–19, dependent on an amended claim, are determined to be patentable.

1. An X-ray image capture element comprising:
   a base plate having a top surface and a bottom surface;
   a plurality of discrete array modules juxtaposed over the top surface of the base plate such that each module is disposed adjacent at least one other module to form a two-dimensional mosaic of modules, each of said modules including a dielectric substrate having a top surface and a bottom surface disposed adjacent the top surface of said base plate, and a plurality of transistors arrayed adjacent the top surface of said dielectric substrate,
   *wherein at least one precision-ground edge of each dielectric substrate forms a precise abutment with a precision-ground edge of another dielectric substrate in a lateral plane substantially parallel to the top surface of said base plate;* and
   a continuous radiation detecting layer disposed over the plurality of array modules, said radiation detecting layer for producing electrical charges representative of a pattern of incident x-ray radiation.

2. An X-ray image capture element in accordance with claim 1, wherein the dielectric substrate of each array module is rectangular in shape[, and wherein at least one precision-ground edge of each dielectric substrate forms a precise abutment with a precision-ground edge of another dielectric substrate in a lateral plane substantially parallel to the top surface of said base plate].

3. An X-ray image capture element in accordance with claim [2] *1* wherein each precision-ground edge has a bevel disposed adjacent the bottom surface of the dielectric substrate.

14. A method for producing an X-ray image capture element comprising:
   *precisely cutting and grinding at least one edge of each of a plurality of discrete array modules, each of said modules including a dielectric substrate having a top surface and a bottom surface placed adjacent the top surface of a base plate, and a plurality of transistors arrayed adjacent the top surface of said dielectric substrate, to form at least one precision-ground edge on each dielectric substrate;*
   juxtaposing [a] *said* plurality of discrete array modules in an assembly over the top surface of [a] *said* base plate such that each module is disposed adjacent at least one other module to form a two-dimensional mosaic of the modules[, each of said modules including a dielectric substrate having a top surface and a bottom surface placed adjacent the top surface of said base plate, and a plurality of transistors arrayed adjacent the top surface of said dielectric substrate];
   *abutting at least one precision-ground edge of each dielectric substrate with a precision-ground edge of another dielectric substrate to form a precise abutment of said precision ground edges in a lateral plane substantially parallel to the top surface of said base plate;* and
   forming a continuous radiation detecting layer over the plurality of array modules, said radiation detecting layer for producing electric charges representative of a pattern of incident x-ray radiation.

15. A method for producing an X-ray image capture element in accordance with claim 14 wherein the dielectric substrate of each array module is rectangular in shape[, and wherein the juxtaposing step is performed by precisely cutting and grinding at least one edge of each dielectric substrate and by abutting a precision-ground edge of each dielectric substrate with a precision-ground edge of another dielectric substrate in a lateral plane substantially parallel to the top surface of said base plate such that the non-radiation detecting space between the array modules is minimized].

16. A method for producing an X-ray image capture element in accordance with claim [15] *14* wherein the cutting and grinding step also includes forming a bevel in each precision-ground edge adjacent the bottom surface of the dielectric substrate.

20. A method for producing an X-ray image capture element in accordance with claim 17 wherein the step of forming the continuous top conducting layer is [perforated] *performed* by vapor depositing a material selected from the group consisting of indium-tin oxide, aluminum, gold and copper.

* * * * *